(12) United States Patent
Albrecht (10) Patent No.: US 9,714,962 B2
(45) Date of Patent: Jul. 25, 2017

(54) MONITORING DEVICE AND METHOD FOR MONITORING A LINE SECTION USING A MONITORING DEVICE

(71) Applicant: Micronas GmbH, Freiburg (DE)

(72) Inventor: Stefan Antonius Albrecht, Mauchenheim (DE)

(73) Assignee: TDK-Micronas GmbH, Freiburg (DE)

( * ) Notice: Subject to any disclaimer, the term of this patent is extended or adjusted under 35 U.S.C. 154(b) by 0 days.

(21) Appl. No.: 14/509,803

(22) Filed: Oct. 8, 2014

(65) Prior Publication Data

US 2015/0022182 A1 Jan. 22, 2015

Related U.S. Application Data

(62) Division of application No. 13/743,123, filed on Jan. 16, 2013, now abandoned.

(Continued)

(30) Foreign Application Priority Data

Jan. 16, 2012 (DE) .................. 10 2012 000 557

(51) Int. Cl.
*G01R 31/02* (2006.01)
*G01R 19/04* (2006.01)
(Continued)

(52) U.S. Cl.
CPC ............. *G01R 19/04* (2013.01); *G01R 1/203* (2013.01); *G01R 19/0092* (2013.01); *G01R 35/005* (2013.01); *G01R 31/006* (2013.01)

(58) Field of Classification Search
CPC .......... H05G 1/12; H05G 1/18; G01R 31/333; G01R 31/327; G01R 31/3658;
(Continued)

(56) References Cited

U.S. PATENT DOCUMENTS

| 4,277,749 A | 7/1981 | Traub |
| 5,703,490 A * | 12/1997 | Kennedy ............ G01R 19/0092 324/650 |

(Continued)

FOREIGN PATENT DOCUMENTS

| DE | 100 13 345 A1 | 10/2001 |
| EP | 0 206 488 A1 | 12/1986 |

(Continued)

*Primary Examiner* — Patrick Assouad
*Assistant Examiner* — Demetrius Pretlow
(74) *Attorney, Agent, or Firm* — Muncy, Geissler, Olds & Lowe, P.C.

(57) ABSTRACT

A monitoring device is provided that includes a first line section with a first connection point and a second connection point spaced apart from the first connection point in the direction of the line, and with a control unit and with a first current sensing unit, having a current source. A first switch is inserted into the first connecting line and connects the first current source to the first connection point or disconnects it therefrom. In a first state the first switch is closed and the first current is impressed on the first line section and a first voltage determined by the amplitude of the actual current, and in a second state the first switch is open and a second voltage is determined, and the control unit is configured to ascertain the amplitude of the first actual current from the two voltages.

22 Claims, 4 Drawing Sheets

Related U.S. Application Data (60) Provisional application No. 61/588,971, filed on Jan. 20, 2012.

(51) Int. Cl.
  *G01R 1/20* (2006.01)
  *G01R 35/00* (2006.01)
  *G01R 19/00* (2006.01)
  *G01R 31/00* (2006.01)

(58) Field of Classification Search
  CPC ........... G01R 17/16; G01R 23/09; H03F 1/04; H01H 1/0015; Y02B 70/1408
  USPC ..... 324/119, 123 R, 415, 426–430; 323/350, 323/351, 271, 273, 282
  See application file for complete search history.

(56) References Cited

U.S. PATENT DOCUMENTS

| | | | |
|---|---|---|---|
| 5,804,979 A | 9/1998 | Lund et al. | |
| 6,111,767 A * | 8/2000 | Handleman | G05F 1/67 136/293 |
| 6,177,814 B1 * | 1/2001 | Taguchi | G01R 19/04 327/336 |
| 6,285,191 B1 | 9/2001 | Gollomp et al. | |
| 6,522,123 B2 | 2/2003 | Ribes | |
| 7,443,643 B2 * | 10/2008 | Kubo | G01R 31/025 324/509 |
| 2003/0020453 A1 | 1/2003 | Trumpler et al. | |
| 2004/0135590 A1 | 7/2004 | Quon | |
| 2004/0207967 A1 * | 10/2004 | Ohshima | H02H 3/087 361/93.1 |
| 2005/0151543 A1 | 7/2005 | Taylor | |
| 2008/0143288 A1 * | 6/2008 | Iwaji | H02P 6/10 318/722 |
| 2010/0066294 A1 * | 3/2010 | Hendrickson | B60L 3/0023 318/490 |

FOREIGN PATENT DOCUMENTS

| | | |
|---|---|---|
| EP | 0 878 717 A2 | 11/1998 |
| WO | WO 01/27641 A1 | 4/2001 |
| WO | WO 2006/002446 A1 | 1/2006 |

\* cited by examiner

MONITORING DEVICE AND METHOD FOR MONITORING A LINE SECTION USING A MONITORING DEVICE

This nonprovisional application is a division of U.S. application Ser. No. 13/743,123 which was filed on Jan. 16, 2013 and which claims priority to German Patent Application No. DE 10 2012 000 557.1, which was filed in Germany on Jan. 16, 2012, and to U.S. Provisional Application No. 61/588,971, which was filed on Jan. 20, 2012, and which are both herein incorporated by reference.

BACKGROUND OF THE INVENTION

Field of the Invention

The invention relates to a monitoring device and a method for monitoring a line section using a monitoring device.

Description of the Background Art

Known from EP 0 206 488 A1 and U.S. Pat. No. 6,285,191 B1 are measurement devices for monitoring currents, in particular of batteries in automobiles. In addition, measurement devices of the generic type are also known from U.S. Pat. No. 6,522,123 B2 and US 2005/0151543 A1, U.S. Pat. No. 4,277,749, DE 100 13 345 A1 and U.S. Pat. No. 6,285,191 B1.

According to the disclosure of U.S. Pat. No. 6,285,191 B1, the current of a ground line is monitored in that, in a first alternative, the current is ascertained from the measured voltage drop in the ground cable and the known resistance of the ground line based on Ohm's law. According to a second alternative, the current in the ground cable is ascertained for an unknown resistance of the ground cable by means of a self-calibrating instrumentation amplifier from the voltage drop. Calibration is carried out using a precision resistor and a precision current source. Moreover, the voltage drop in the ground cable is conducted to an input of the instrumentation amplifier by means of an adjustable voltage divider. The voltage divider must likewise be calibrated. The current in the ground cable is calculated from the comparison of the voltage drop at the precision resistor from the output of the instrumentation amplifier and the current source.

EP 0 206 488 A1 discloses measuring the voltage drop in a line through which current passes, in particular in a ground cable, by means of a Kelvin measurement circuit. The amplitude of the current in the line is determined from the voltage drop. To carry out the measurement, in a first step, a constant current source is connected to the line by means of the Kelvin measurement circuit in order to calibrate a measurement instrument with a known current from the current source. Under operating conditions, i.e., when current from a battery flows through the ground cable, or in more general terms the line, the amplitude of the current in the ground cable is ascertained from the measured voltage drop in the ground cable by means of the previously calibrated measurement instrument.

SUMMARY OF THE INVENTION

It is therefore an object of the invention to provide a monitoring device and a method for monitoring a line section using a monitoring device.

According to an embodiment of the invention, a monitoring device is provided having a first line section with a first connection point and a second connection point spaced apart from the first connection point in the direction of the line, and having a control unit and a first current sensing unit, having a first current source, wherein the first current source is connected to the first connection point by a first connecting line and to the second connection point by a second connecting line and outputs a first current, having a first switch with a control input, wherein the first switch is inserted into the first connecting line and connects the first current source to the first connection point or disconnects it therefrom, having a first differential amplifier with a first input, a second input, and an output, wherein the first input is connected to the first connection point by a third connecting line and the second input is connected to the second connection point by a fourth connecting line, wherein the control unit is inserted between the output of the first differential amplifier and the control input of the first switch, wherein an actual current is passed through the first line section, and in a first state the first switch is closed and the first current is impressed on the first line section in addition to the actual current and a voltage determined by the amplitude of the actual current and the amplitude of the first current is present between the first input and second input of the first differential amplifier, and in a second state the first switch is open and a voltage determined exclusively by the actual current is present between the first input and second input of the first differential amplifier, and the control unit is configured to ascertain the amplitude of the actual current from the two voltages.

According to an embodiment of the invention, a method for monitoring a first line section using a monitoring device is provided, wherein the first line section has a first connection point and a second connection point spaced apart from the first connection point in the direction of the line, wherein the monitoring device has a control unit and a first current sensing unit, and the first current sensing unit has a current source, wherein the first current source is connected to the first connection point by a first connecting line and to the second connection point by a second connecting line and outputs a first current, wherein a first switch with a control input is provided and the first switch is inserted into the first connecting line and the first switch connects the first current source to the first connection point or disconnects it therefrom, wherein a first differential amplifier with a first input, a second input, and an output is provided and the first input of the first differential amplifier is connected to the first connection point by a third connecting line and the second input of the first differential amplifier is connected to the second connection point by a fourth connecting line, and wherein the control unit is inserted between the output of the first differential amplifier and the control input of the first switch, wherein an actual current is passed through the first line section, and wherein in a first state the first switch is closed and the first current is impressed on the first line section in addition to the actual current and a voltage determined by the amplitude of the actual current and the amplitude of the first current is present between the first input and second input of the first differential amplifier, and in a second state the first switch is open and a voltage determined exclusively by the amplitude of the actual current is present between the first input and second input of the first differential amplifier, and the amplitude of the actual current is ascertained from the two voltages by means of the control unit.

An advantage of the monitoring device and the method for monitoring a first line section using a monitoring device is that during normal operation of a device, the current in a line of the device, in particular in a ground line of an electrical load, can be sensed without opening the line to be monitored, and in particular without interposing a costintensive shunt resistor and even without knowledge of the line resistance of the line section to be monitored. Moreover, standardization, i.e., calibration, of the voltage measurement instrument before a measurement is also rendered unnecessary. Investigations have shown that in the vast majority of cases, impressing the first current during ongoing operation causes only little or no impairment to the ongoing operation of the device. It is advantageous when the amplitude of the first current is in general chosen to be smaller than the actual current. Because even very low voltage values below 100 mV can be measured precisely, the method is also suitable for a low line resistance of the first line section of less than 0.1 ohms. Furthermore, by means of the precise measurement of low voltages, the method can in particular be used for monitoring lines with currents having a high amplitude, preferably above 100 mA, most preferably above 1 A.

It is a matter of course that in accordance with Ohm's law the resistance of the line section can also be determined from a single measurement using a known current amplitude and the measured voltage if no actual current is impressed. However, investigations have shown that the accuracy of measurement of the resistance, especially of ground cables, is completely unsatisfactory because of the very low line resistance, among other reasons. Furthermore, the resistance of the line sections depends on the age of the line and environmental influences such as humidity and temperature, and in some cases is nonlinear in certain ranges of current amplitude. As a result, resistance measurements on lines through which no current is flowing provide only inaccurate results, especially when the measurements were performed a relatively long time ago. In contrast thereto, the monitoring device according to the invention achieves a significantly more accurate sensing of the current amplitude under real operating conditions. It should be noted that the control unit can be configured to ascertain the amplitude of the actual current by means of the value of the voltage in the first state and by means of the value of the voltage in the second state and the amplitude of the first current. Stated differently, the calculation of the amplitude of the actual current is carried out by means of the control unit from a measurement of the voltage in the first state and a measurement of the voltage in the second state and a measurement of the amplitude of the first current. In this way, the determination of the generally very small line resistance of the first line section, which has heretofore been used in the prior art and usually is very inaccurate, is avoided. According to an enhancement, in order to determine the actual current, the actual current formula used is equal to the product of the first current times the voltage measured in the second state divided by the difference between the voltage measured in the first state and the voltage measured in the second state. In this way, the amplitude of the actual current can be ascertained without calculating the line resistance of the first line section.

According to an embodiment, the first current is impressed as a direct current in a first alternative and as an alternating current in a second alternative. Investigations have shown that when the current is impressed as a direct current in a first alternative, no time-varying disruptions are impressed on the electrical network in the line and the device. In this design, it is advantageous [in the case of] direct current to slowly raise the first current to a first nominal amplitude when the current source is switched on and to slowly lower the first current to zero before the current source is disconnected from the line section. An embodiment according to the second alternative is especially advantageous when the actual current itself represents an alternating current and the impression of a first direct current is not desirable. In one embodiment, it is preferred for the frequency of the first current do be designed to be different from the frequency of the actual current. According to one embodiment, an alternating current is fed into the first line section by means of the control unit in such a manner that the variation of the voltage is sensed by a lock-in principle, and by this means the amplitude of the actual current can be reliably sensed even for small changes in the voltages, preferably below 0.1 V, most preferably below 1 mV.

In an embodiment, the first current source has a control input connected to the control unit. In this way, the first current source can be switched both on and off by means of the control unit. Furthermore, the amplitude of the first current, and if applicable the frequency of the first current in the embodiment of alternating current, can be set, and in particular regulated as well. The control input for regulating the first current source can be, among other things, the amplitude of the voltage difference between the measurements during the first and second states.

According to another enhancement, the first current sensing unit includes an ADC, wherein the ADC is connected between the output of the first differential amplifier and the control unit. It is an advantage that, as a result of the conversion of the analog voltage amplitudes into a digital count value, the data can be processed simply and reliably in the control unit, which preferably includes a processor.

In an embodiment, the first current source can be connected to the first line section by means of the first switch and a second switch and a third switch and a fourth switch in the form of an H-bridge circuit. An advantage of the H-bridge circuit is that the first current from the first current source can be fed into the first line section in both technical directions of current without further effort.

In an embodiment, the first differential amplifier is connected to the first line section by means of an H-bridge circuit. In this way, the two inputs of the differential amplifier can be connected to the first line section in such a way that the voltage difference between the two inputs is always present in the same direction and has the same sign. Furthermore, it is advantageous to connect a circuit unit having the first differential amplifier and the ADC to the first line section by means of an H-bridge circuit.

According to an embodiment, a second line section with a second current sensing unit with a second differential amplifier is provided, wherein a second current is fed into the second line section. The second line section can be directly adjacent to the first line section. It is a matter of course that the second current sensing unit has circuit components corresponding to the first current sensing unit and that the circuit components are likewise connected in a corresponding manner. It is understood that in an especially advantageous refinement, the first current and the second current are essentially opposite and equal in amplitude. An advantage is that no current is fed into or impressed outside the two line sections. In this way, interference with or effects on the device are essentially avoided.

In an embodiment, the control unit has a third differential amplifier, wherein a first input of the third differential amplifier is connected to the output of the first differential amplifier and a second input of the third differential amplifier is connected to the output of the second differential amplifier, and the first differential amplifier and second differential amplifier and third differential amplifier form a multi-stage amplifier unit. An advantage is that a sum of the voltage differences measured at the first line section and the second line section is present at the output of the multi-stage amplifier unit.

In another embodiment, a third line section is provided in addition to the first line section and the second line section. The first line section and the second line section preferably are connected in series between a voltage source and a current source, for example between a battery and a ground potential. At least one first current source with a first differential amplifier is associated with the first line section, and at least one second current source with a second differential amplifier is associated with the second line section. In the present case, the third line section includes a battery with the battery's associated internal resistance and a line switch. The line switch is inserted between a predetermined point that is connected to a load, and labeled number 15 in a motor vehicle by way of example, and the positive pole of the battery. The line switch connects or disconnects the positive pole of the battery to the particular section of the line that leads to the load. A third adjustable current source is provided in parallel with the second current source. The control input of the third current source is connected to the control unit. By means of the third current source, the amplitude of the third current can be raised or lowered in such a manner that the summed value of the second and third currents is equal to, or preferably is approximately equal to, the value of the first current.

In an embodiment, a first circuit arrangement is provided. The first circuit arrangement comprises an analog-to-digital converter and a differential amplifier, and has a differential input connected to a first line section by a third H-bridge, and has an output connected to the control unit. The third H-bridge comprises a ninth bridge switch and a tenth bridge switch.

A second circuit arrangement is provided in addition to the first circuit arrangement. The second circuit arrangement comprises an analog-to-digital converter and a differential amplifier, and has a differential input connected to a second line section by a fourth H-bridge, and has an output connected to the control unit. The fourth H-bridge comprises a thirteenth bridge switch, a fourteenth bridge switch, a fifteenth bridge switch, and a sixteenth bridge switch. In a first mode, all bridge switches of the third H-bridge and in the fourth H-bridge are open. Furthermore, all bridge switches of the first H-bridge and all bridge switches of the second H-bridge are open in the first mode. All control inputs are preferably connected to the control unit ST. Moreover, a third circuit arrangement is provided, wherein the third circuit arrangement includes a differential amplifier and an analog-to-digital converter.

Because each of the first to third current sources, and each of the first to third circuit arrangements as well, is connected to the associated line sections by an H-bridge, the result is great flexibility with regard to measurement of the voltage values at the first line section and at the second line section and in the combination of the individual measured voltage values.

Furthermore, a first input of the third circuit arrangement is connected to the ground potential, and a second input of a third circuit arrangement is connected to the positive pole of the battery. The first input and second input form a differential input. The output of the third circuit arrangement is connected to the control unit.

When the line switch is closed, the actual current flows from the battery and causes a voltage change at the differential input of the third circuit arrangement. In principle, the voltage change results from a comparison of the voltage present at the differential input of the third circuit arrangement when a line switch is open and when a line switch is closed. In this way, the loading of the batteries, which is to say the amplitude of the current drawn, can be determined. Moreover, the state of charge of the battery can be monitored from the measured voltage of the battery with a line switch open.

Investigations have shown that, in particular, shunting of the battery can be identified in the case of a closed line switch with an evaluation of the voltage values of the first circuit arrangement and the voltage values up to and including the third circuit arrangement.

In another embodiment, the first H-bridge and the connected first current source can be aggregated into a first circuit block. Moreover, the second H-bridge and the connected second current source can be aggregated into a second circuit block. The third H-bridge and the connected first circuit arrangement can be aggregated into a first circuit section, and the fourth H-bridge and the connected second circuit arrangement can be aggregated into a second circuit section. The first circuit block, second circuit block, first circuit section, and second circuit section can be aggregated into a first circuit unit. The current in a single-phase generator or an electric motor can be monitored with such a circuit unit.

In another embodiment, a second circuit unit and a third circuit unit are provided in addition to the first circuit unit. The second circuit unit and the third circuit unit have a structure corresponding to that of the first circuit unit. Preferably, the first circuit unit is connected to a first generator phase, and the second circuit unit is connected to a second generator phase, and the third circuit unit is connected to a third generator phase. In this way, the current amplitudes in each of the three generator phases can be ascertained and monitored.

Investigations have shown that the monitoring device is especially suitable for monitoring and ascertaining the phase currents of a generator or an electric motor. Phase currents are understood to mean the currents in the output leads of a generator. Such phase currents can easily reach current amplitudes of 10 A and more.

Furthermore, the monitoring device is especially suitable for ascertaining the state of charge of a battery. In this application, the first connection point is the positive pole of the battery and the second connection point is the negative pole of the battery.

Furthermore, the monitoring device is especially suitable for monitoring the current in the ground lead of the battery in a motor vehicle. The ground line from the battery to the vehicle is where especially high currents flow during the starting process, wherein it is advantageous to monitor the current amplitudes thereof for fault detection in a motor vehicle. Furthermore, it is advantageous to ascertain or monitor the state of charge of the battery by means of the monitoring device. Furthermore, the current amplitude in the positive branch between the battery, in particular within the on-board power network of an automobile, and a load can be ascertained and monitored by means of the monitoring device.

Another especially advantageous application resides in the use of the monitoring device for in-situ calibration of unknown current amplitudes in a line section, wherein the variation of the current amplitudes in the line section advantageously spans at least a factor of ten. In this way, line sections that have completely different current amplitudes can be monitored in a simple and reliable way.

The invention is explained in detail below with reference to the drawings. Like parts are labeled with identical designations here. The embodiments shown are highly schematic, which is to say that the distances and lateral and vertical extent are not to scale, and unless otherwise specified do not have any derivable geometric relationship to one another. In the drawings, Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
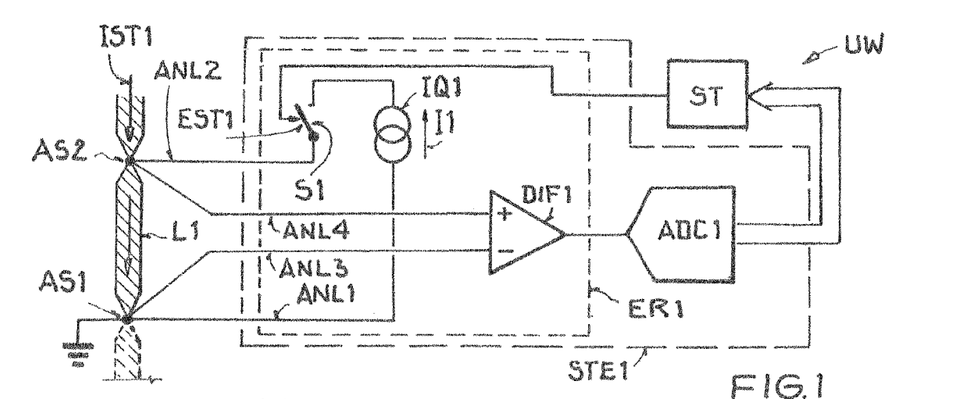
FIG. 1 shows a first embodiment of the monitoring device with a first current sensing unit.

The diagram in FIG. 1 shows a monitoring device UW with a first line section L1 with a first connection point AS1 and a second connection point AS2 spaced apart from the first connection point AS1 in the direction of the line. The monitoring device UW has a control unit ST and a first current sensing unit STE1, as well as a first analog-to-digital converter ADC1, a first differential amplifier DIF1, and a first current source IQ1. The first current source 101 is connected to the first connection point AS1 by a first connecting line ANL1, and to the second connection point AS2 by the second connecting line ANL2. The first current source IQ1 outputs a first current I1. In addition, a first switch S1 is provided with a control input EST1, wherein the first switch S1 is inserted into the first connecting line ANL1, and connects the first current source 101 to the first connection point AS1 or disconnects it therefrom.

The first circuit unit SE1 has a first analog-to-digital converter ADC and a first differential amplifier DIF1. The first differential amplifier DIF1 has a first input, a second input, and an output, wherein the first input is implemented as an inverting input and is connected to the first connection point AS1 by a third connecting line ANL3, and the second input is implemented as a non-inverting input and is connected to the second connection point AS2 by a fourth connecting line ANL4. The output of the differential amplifier is connected to an input of an analog-to-digital converter ADC. The analog-to-digital converter ADC has an output connected to the control unit ST. Hence, the first circuit unit SE1 is inserted between the output of the first differential amplifier DIF1 and the control input EST1 of the switch S1. Moreover, the control unit ST is connected to the control input EST1 of the first switch S1. Together with the first current source IQ1 and the first switch S1, the first differential amplifier DIF1 forms a first analog circuit block ER1.

The first line section L1 is connected to the first connection point AS1 at a reference voltage designed as ground potential. A first actual current IST1 flows in the first line section L1, which is to say that a device that is not shown is operated and draws current. In a first state, the first switch S1 is closed and the first current I1 is impressed on the first line section L1 in addition to the actual current IST1. As a result, a first voltage U1 is present between the first input and second input of the first differential amplifier DIF1. The first voltage U1 is determined by the amplitude of the first actual current IST1 and the amplitude of the first current I1 and the non-negligible line resistance of the first line section L1. In a second state, the first switch S1 is open and a second voltage U2 determined exclusively by the first actual current IST1 is present between the first input and second input of the first differential amplifier DIF1. It is a matter of course that the second voltage U2 is different from the first voltage U1. If the first current I1 has the same technical direction of current as the first actual current IST1, the first voltage U1 is larger than the second voltage U2. Conversely, the second voltage U2 is larger than the first voltage U1 if the technical directions of the two currents are opposite. It is understood that the absolute value of the first voltage U1 and the second voltage U2 are always meant here. Furthermore, it should be noted that the amplitude of the first current I1 is in general chosen to be smaller than the amplitude of the first actual current IST1.

The amplitude of the first actual current IST1 is determined from the difference of the first voltage U1 and the second voltage U2 by means of the control unit ST. It can be appreciated that knowledge of the amplitude of the first current I1 is needed to ascertain the first actual current IST1. In this way, a calculation or knowledge of the resistance of the first line section is avoided in an advantageous manner.

Figure 2:
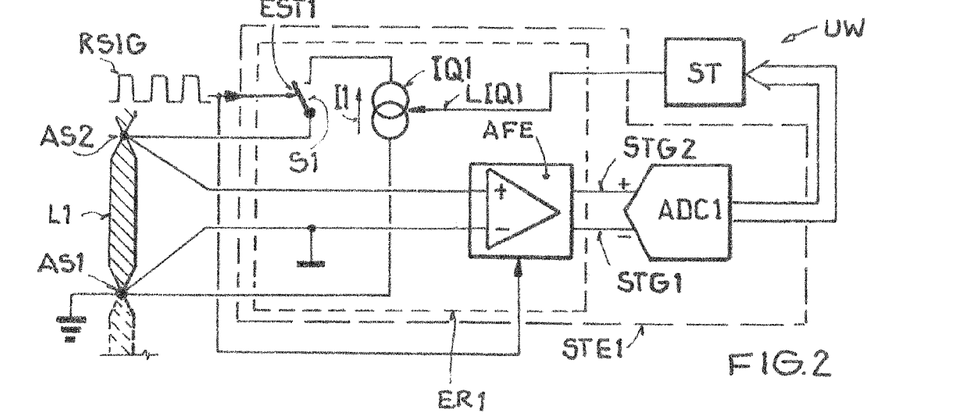
FIG. 2 shows a second embodiment of the monitoring device, wherein a first current is impressed as an alternating current by the first monitoring device.

The representation in FIG. 2 shows a second embodiment of the monitoring device UW. Only the differences from the representation in FIG. 1 are explained below. The first differential amplifier DIV1 is integrated into a first analog circuit unit AFE. The first analog circuit unit AFE1 is connected to the first analog-to-digital converter ADC1 by a first inverting signal line SIG1 and a noninverting signal line SIG2. In this way, differential signals can be applied to the first analog-to-digital converter ADC1. Furthermore, a square-wave signal RSIG is present at the control input EST1 of the first switch S1 and the first analog circuit unit AFE1. In addition, the first current source IQ1 has a control input. The control input of the first current source IQ1 is connected to the control unit ST by means of a control line LIQ1. The signal RSIG is produced by an external source that is not shown. In accordance with an alternative that is not shown, the signal RSIG can also be generated by means of the control unit ST. Together with the first current source IQ1 and the first switch S1, the first analog circuit unit AFE1 forms the first analog circuit block ER1.

The first switch S1 is alternately closed and opened by means of the signal RSIG. A first current I1 is always impressed when the switch S1 is closed. The amplitude of the first current I1 can be changed by means of the control unit SC.

Figure 3:
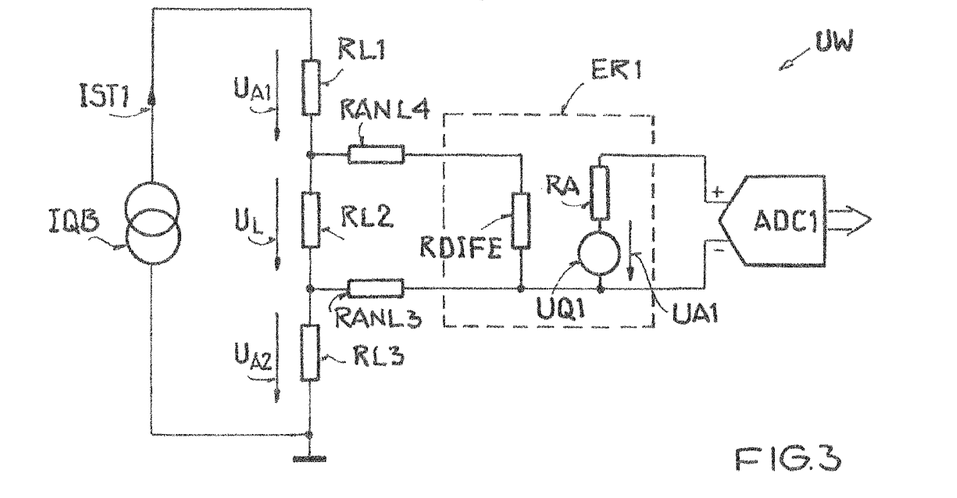
FIG. 3 shows an equivalent circuit diagram of a monitoring device according to the embodiment from FIG. 1.

FIG. 3 shows an equivalent circuit diagram of a monitoring device according to the embodiment shown in FIG. 1 or the embodiment shown in FIG. 2. Only the differences from one of the preceding figures are explained below. The first actual current IST1 is impressed by a current source IQB on a series circuit having a first line resistance RL1 and a second line resistance RL2 and a third line resistance RL3. A first voltage UA1 drops across the first line resistance RL1, a second voltage UA2 drops across the second line resistance RL2, and a third voltage drops across the third line resistance RL3. The third connecting line ANL3 is represented by a fourth resistance RANL3, and the fourth connecting line ANL4 is represented by a fifth resistance RANL4. The input resistance of the first circuit block ER1 is represented by means of a sixth resistance RDIFE. It should be noted that in the present case the input resistance is determined primarily by the input resistance of the first differential amplifier DIF1. The output of the first analog circuit block ER1 is represented by a first voltage source UQ1 with an output resistance RA connected in series. The first voltage source UQ1 generates a first output voltage UA1, which is present at the differential input of the first analog-to-digital converter ADC1 via the output resistance RA. In this way, it is evident that a monitoring device can be produced purely using analog circuit techniques even without an analog-to-digital converter.

Figure 4A:
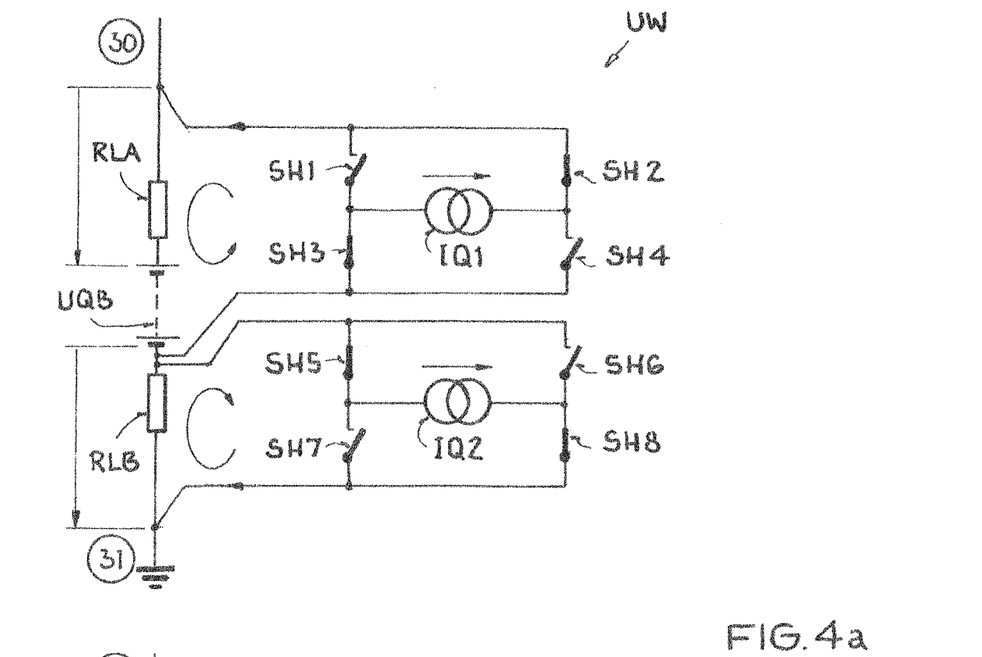
FIG. 4a shows an equivalent circuit diagram of the monitoring device with a first current source embedded in a first H-bridge circuit in a first circuit state, and a second current source embedded in a second H-bridge circuit in a first circuit state.

For reasons of clarity, FIG. 4a shows a part of another embodiment of the monitoring circuit UW as a greatly simplified equivalent circuit diagram. Only the differences from the preceding figures are explained below. The first current source IQ1 is connected with a first H-bridge to the first line section L1. For reasons of clarity, the associated control inputs of all bridge circuits are not shown. In this design, the first line section L1 includes a voltage source UQB as well as the line through which only current passes. Here, the circled numbers 30 and 31 label selected points of the cable routing in a motor vehicle, wherein the numbers 30 generally designate the positive input of the battery and 31 the return line from the negative pole of the battery to the ground cable in a motor vehicle. In a motor vehicle, the negative pole of the battery UQB is connected to the body by the ground cable. The line resistance of the first line section L1 and the internal resistance of the battery UQB are represented by a single equivalent resistance RLA. The first H-bridge comprises a first bridge switch SH1, a second bridge switch SH2, a third bridge switch SH3, and a fourth bridge switch SH4. In the first H-bridge, the first bridge switch SH1 and fourth bridge switch SH4 are open, and the second bridge switch SH2 and third bridge switch SH3 are closed. In this way, the first current source IQ1 is connected to the first line section L1 in such a way that the first current I1 is impressed with a technical direction of current in the direction of the reference voltage or the ground potential.

A second current source IQ2 is provided in addition to the first current source IQ1. The second current source IQ2 is connected with a second H-bridge to a second line section L2 that is not shown directly. The line resistance of the second line section L2 is represented by an equivalent resistance RLB. The second H-bridge comprises a fifth bridge switch SH5, a sixth bridge switch SH6, a seventh bridge switch SH7, and an eighth bridge switch SH8. In the second H-bridge, the fifth bridge switch SH5 and eighth bridge switch SH8 are closed, and the sixth bridge switch SH6 and seventh bridge switch SH7 are open. In this way, the second current source IQ2 is connected to the second line section L2 in such a way that the second current I2 is impressed with a technical direction of current opposite the direction of the first current I1.

Investigations have shown that it is especially advantageous for the amplitude of the first current I1 to be essentially opposite and equal in amplitude to the second current I2. In this way, the line network outside the monitoring device, for example in the direction of a load that is not shown, is not loaded by the monitoring device, which is to say that no additional voltage drop is present in the line network outside the monitoring device. Furthermore, a voltage source, such as for example a battery UQB, can also be monitored in an especially simple and advantageous manner.

Figure 4B:
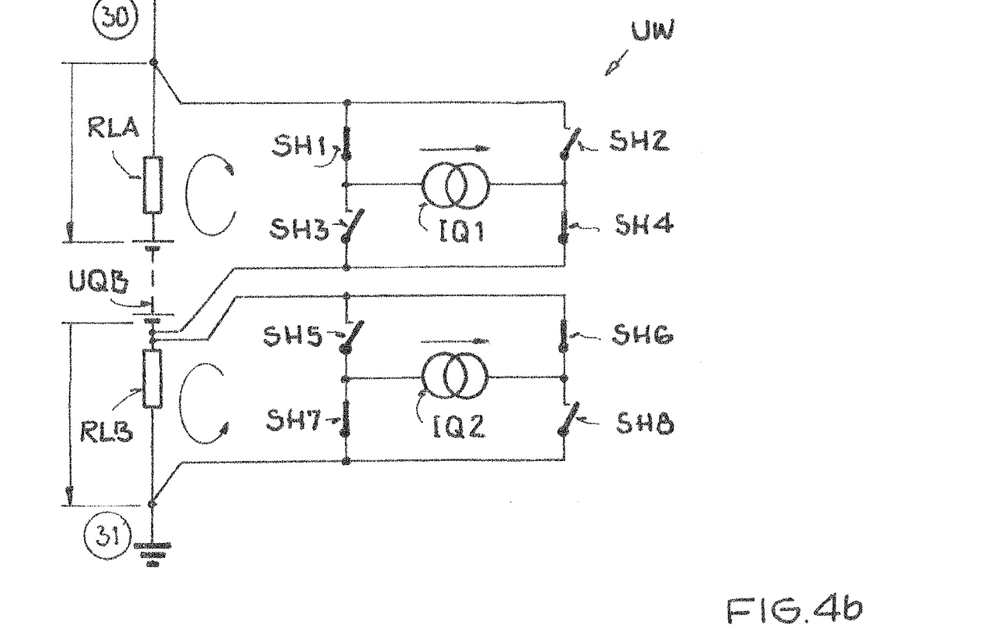
FIG. 4b shows an equivalent circuit diagram of the monitoring device from FIG. 4a but the two H-bridge circuits are in a second circuit state.

FIG. 4b shows another preferred circuit embodiment of the first current source IQ1 and the second current source IQ2. Only the differences from the embodiment in FIG. 4b are explained below. In the first H-bridge, the first bridge switch SH1 and fourth bridge switch SH4 are closed, and the second bridge switch SH2 and third bridge switch SH3 are open. In this way, the first current source IQ1 is connected to the first line section L1 in such a way that the first current I1 is impressed with a technical direction of current opposite from the direction to the reference voltage or the ground potential.

In the second H-bridge, the fifth bridge switch SH5 and eighth bridge switch SH8 are open, and the sixth bridge switch SH6 and seventh bridge switch SH7 are closed. In this way, the second current source IQ2 is connected to the second line section L2 in such a way that a second current I2 is impressed with a technical direction of current opposite the direction of the first current I1, which is to say that the second current I2 is thus impressed in the direction of the reference voltage or the ground potential. It is preferred for the amplitude of the first current I1 to be made equal to the amplitude of the second current I2. In this way, with the present embodiment as well, the line network outside the monitoring device is not loaded by the monitoring device, which is to say that no additional voltage drop is present in the line network outside the monitoring device.

It should be noted that additional ways of connecting the first current source IQ1 and the second current source IQ2 to the relevant line sections can also be implemented. For example, the amplitudes of the first current I1 and the second current I2 can be added together using two additional circuit implementations. Furthermore, it is advantageous for the first current source IQ1 and the second current source IQ2 both to be implemented as controllable current sources, thereby setting the amplitudes of the current I1 and the second current I2 or regulating them by means of the control unit ST.

Figure 5:
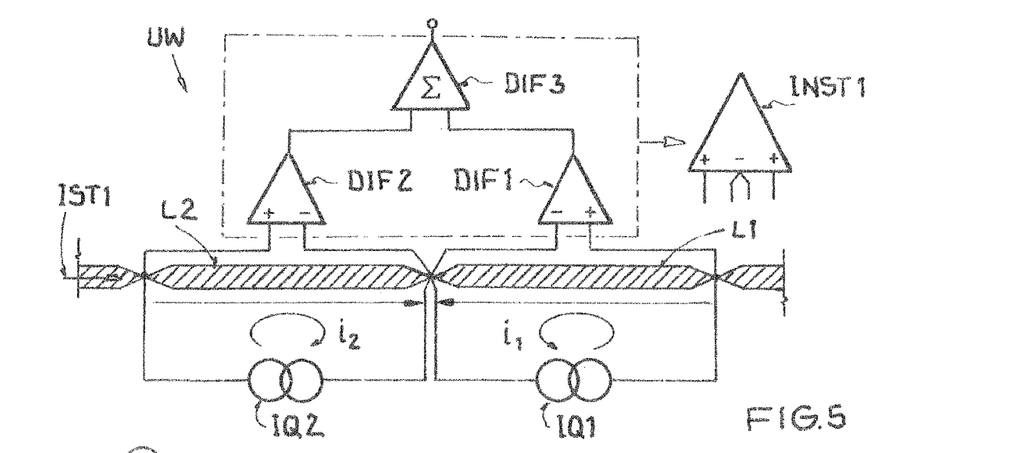
FIG. 5 shows an equivalent circuit diagram of the monitoring unit with a multi-stage amplifier unit.

FIG. 5 shows another embodiment. The embodiment shown has a multi-stage amplifier unit INST1, and for reasons of clarity represents only a part of the monitoring unit in a greatly simplified equivalent circuit diagram. Only the differences from the preceding figures are explained below. The multi-stage amplifier unit INST1 comprises the first differential amplifier DIF1, a second differential amplifier DIF2, and a third differential amplifier DIF3. The first current I1 is impressed on the first line section L1 in addition to the actual current IST1 that flows. The second current I2 is impressed on the second line section L2 in addition to the actual current IST1 that flows. In the present embodiment, the first current I1 is chosen to be opposite and equal in amplitude to the second current I2.

The voltage that drops across the line resistance of the second line section L2 is present at a first input and a second input of the second differential amplifier DIF2. The amplified voltage is output at an output of the second differential amplifier DIF2. The output of the first differential amplifier DIF1 is connected to a first input of the third differential amplifier DIF3 and the output of the second differential amplifier DIF2 is connected to a second input of the third differential amplifier DIF3. The amplified voltage of the sum of the two output voltages of the first differential amplifier DIF1 and the second differential amplifier DIF2 is present at an output of the third differential amplifier DIF3. In contrast to the opposite current directions of the first current I1 and the second current I2, the inputs of the first differential amplifier DIF1 and the inputs of the second differential amplifier DIF2 are connected to the relevant line sections such that the voltage drop of the first line section L1 and the voltage drop of the second line section L2 add together. It should be noted that for reasons of simplification, the first current source IQ1 is shown as hard-wired to the first line section L1 and the second current source IQ2 is shown as hard-wired to the second line section L2.

One advantage is that with the connection of three differential amplifiers DIF1-DIF3 as a multi-stage amplifier unit INST1, even very small voltages in the range below 10 mV can be reliably measured and evaluated. In this way, the actual current IST1 can be ascertained in a simple, reliable, and analog way. From the analog output signals of the multi-stage amplifier unit INST1, with the impressed first current I1 and second current I2 and without the impressed first current I1 and second current I2, the total resistance of the first line section L1 and second line section L2, and thereby the amplitude of the first actual current IST1, can be determined by comparison of the voltage values. In particular, by summation at the third differential amplifier DIF3, it is possible to ascertain the voltage drop due to the impressed first current I1 and thus the line resistance. In a further step, the voltage drop due to the first actual current IST1, and thus the amplitude of the actual current, can be determined by forming the difference at the third differential amplifier DIF3.

Figure 6:
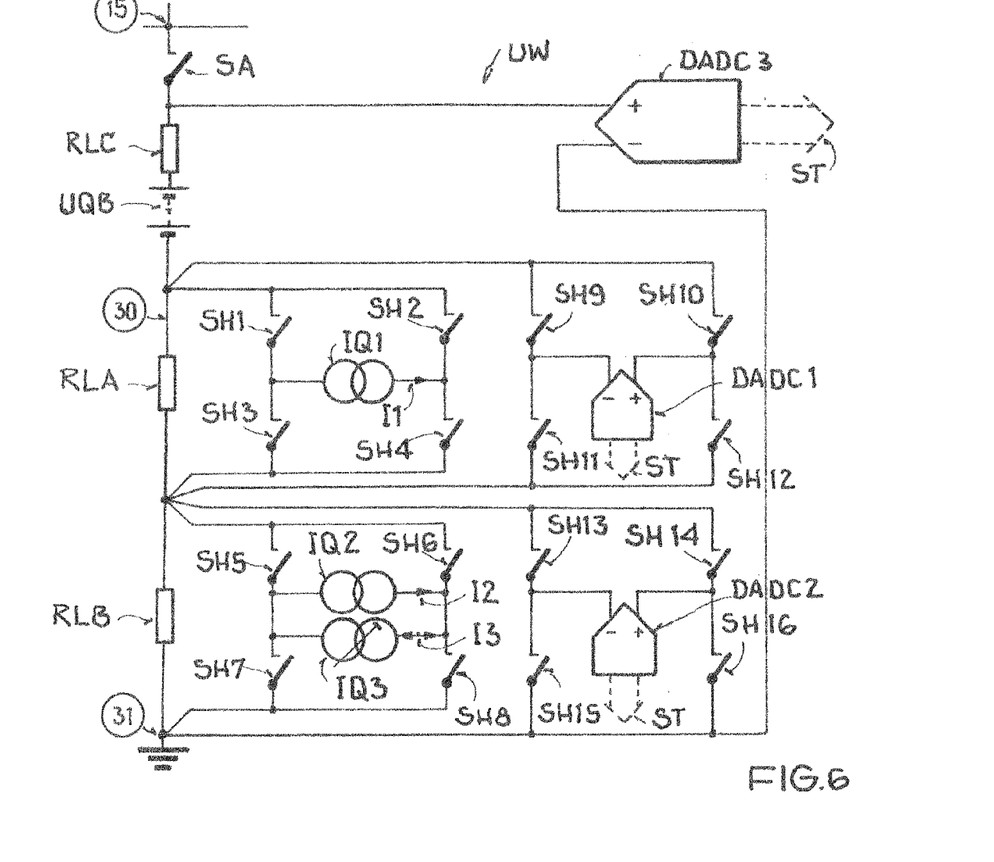
FIG. 6 shows an equivalent circuit diagram of a monitoring device with a parallel circuit of a second current source with a third controllable current source.

FIG. 6 shows another, especially advantageous embodiment of the monitoring device UW. For reasons of clarity, only parts of the monitoring device UW are shown in the present equivalent circuit diagram in this case. Only the differences from one of the preceding figures are explained below. In the present case, the number 15 in a circle labels an additional selected point in the cable routing of a motor vehicle. In addition to the first line section L1 and the second line section L2 with the associated line resistances RLA and RLB, a third line section L3 is provided. In the present case, the third line section L3 includes the battery UQB, the inner resistance of the battery UQB, and a line switch SA with a line section, not shown in detail, between the point with the number 15 and the positive pole of the battery UQB. All elements of the third line section L3 are represented by a single equivalent resistance RLC. The switch SA connects the positive pole of the battery UQB to the section of the line labeled with the number 15 or disconnects the positive pole therefrom. A third adjustable current source IQ3 is provided in parallel with the second current source IQ2. The control input of the third current source IQ3 is connected—not shown—to the control unit ST. By means of the third current source IQ3, the amplitude of the third current I3 can be raised or lowered in such a manner that the summed value of the two currents I2 and I3 exactly matches the value of the first current I1.

Furthermore, a first circuit arrangement DADC1 is provided. The first circuit arrangement DADC1 comprises an analog-to-digital converter and a differential amplifier, and has a differential input connected to the first line section L1 by a third H-bridge, and an output connected to the control unit ST. For reasons of clarity, the associated control inputs of all bridge switches are not shown. The first line section L1 is represented by the equivalent resistance RLA. The third H-bridge comprises a ninth bridge switch SH9, a tenth bridge switch SH10, an eleventh bridge switch SH11, and a twelfth bridge switch SH12, wherein all bridge switches of the third H-bridge are open.

A second circuit arrangement DADC2 is provided in addition to the first circuit arrangement DADC1. The second circuit arrangement DADC2 comprises an analog-to-digital converter and a differential amplifier, and has a differential input connected to a second line section L2 by a fourth H-bridge, and an output connected to the control unit ST. The line resistance of the second line section L2 is represented by an equivalent resistance RLB. The fourth H-bridge comprises a thirteenth bridge switch SH13, a fourteenth bridge switch SH14, a fifteenth bridge switch SH15, and a sixteenth bridge switch SH16. All bridge switches of the fourth H-bridge are open.

Furthermore, all bridge switches of the first H-bridge and all bridge switches of the second H-bridge are open. For reasons of clarity, the control inputs of the bridge switches of the first H-bridge up to and including the control inputs of the bridge switches of the fourth H-bridge are not shown. All control inputs are preferably connected—not shown—to the control unit ST.

Because each of the current sources IQ1 to IQ3, and each of the circuit arrangements DADC1 to DADC3 as well, is connected to the associated line sections by an H-bridge, the result is great flexibility with regard to measurement of the voltage values at the first line section L1 and the second line section L2 and in the combination of the individual measured voltage values.

Furthermore, a first input of a third circuit arrangement DADC3 is connected to the ground potential and a second input of a third circuit arrangement DADC3 is connected to the positive pole of the battery QUB. The first input and second input form a differential input. The output of the third circuit arrangement DADC3 is connected to the control unit ST. The third circuit arrangement DADC3 includes a differential amplifier that is not shown in detail and an analog-to-digital converter.

When the switch SA is closed, the actual current IST1 flows from UQB and causes a voltage change at the differential input of the third circuit arrangement. In principle, the voltage change results from a comparison of the voltage present at the differential input of the third circuit arrangement DADC3 with the switch SA open and with the switch SA closed. In this way, the loading of the batteries, which is to say the amplitude of the current drawn, can be determined. Moreover, the state of charge of the battery UQB can be monitored from the measured voltage of the battery with the switch SA open.

Investigations have shown that, in particular, shunting of the battery UQB can be identified in the case of a closed line switch SA with an evaluation of the voltage values of the first circuit arrangement DADC1 and the voltage value up to and including the third circuit arrangement DADC3.

Figure 7:
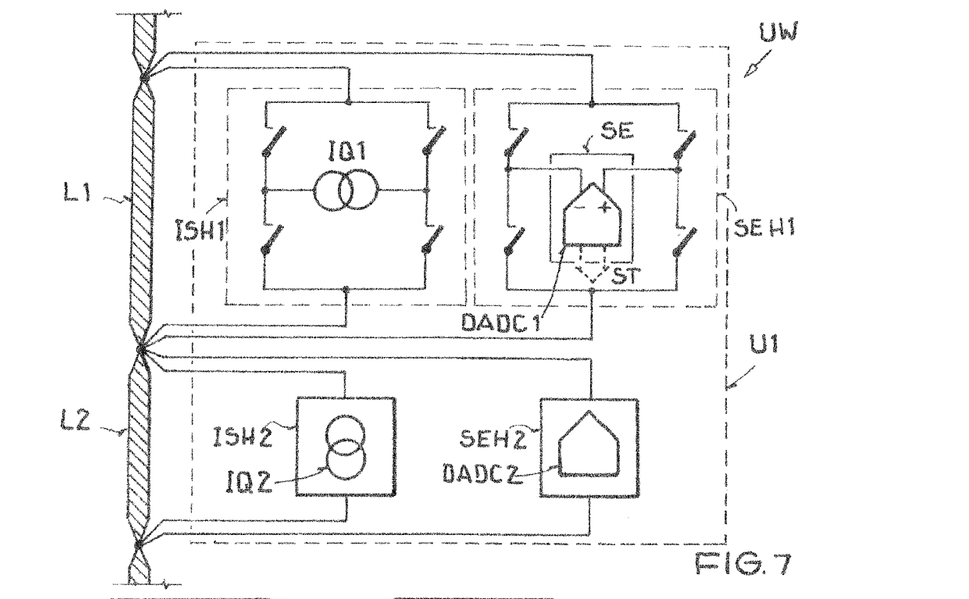
FIG. 7 shows a simplified equivalent circuit diagram of the embodiment from FIG. 6.

FIG. 7 shows a greatly simplified equivalent circuit diagram of a part of the monitoring device UW according to the embodiment shown in FIG. 6. Only the differences from one of the preceding figures are explained below. The first H-bridge and the connected first current source IQ1 are aggregated into a first circuit block ISH1. Moreover, the second H-bridge and the connected second current source IQ2 are aggregated into a second circuit block ISH2. The third H-bridge and the connected first circuit arrangement DADC1 are aggregated into a first circuit section SEH1, and the fourth H-bridge and the connected second circuit arrangement DADC2 are aggregated into a second circuit section SEH2. The first circuit block ISH1, second circuit block ISH2, first circuit section SEH1, and second circuit section SEH2 are aggregated into a first circuit unit U1.

Figure 8:
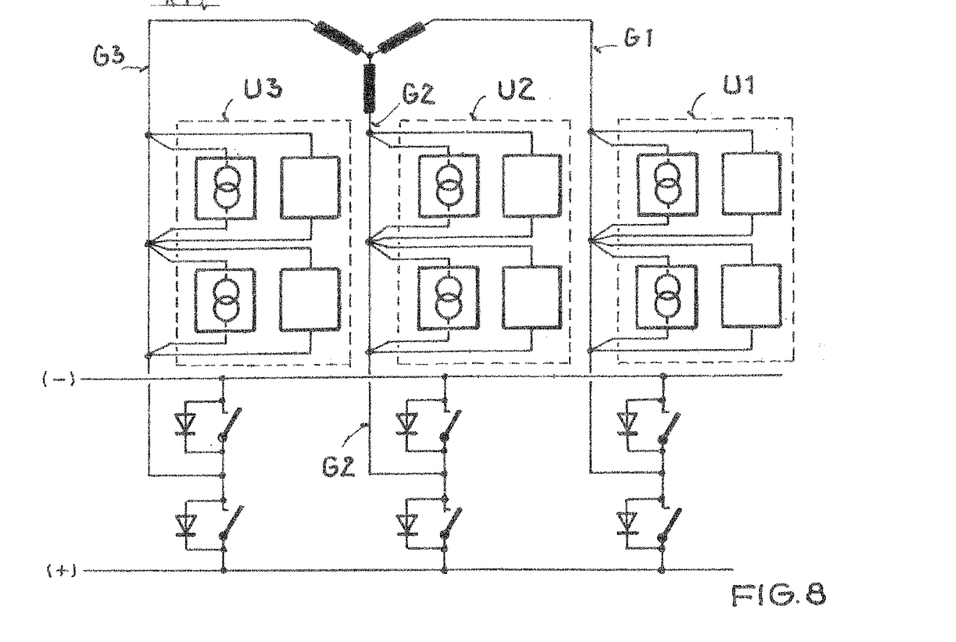
FIG. 8 shows another simplified equivalent circuit diagram with a plurality of monitoring devices.

FIG. 8 shows another simplified equivalent circuit diagram of a monitoring device UW. Only the differences from one of the preceding figures are explained below. In addition to the first circuit unit U1, the monitoring device UW has a second circuit unit U2 and a third circuit unit U3. The first circuit unit U1 is connected to a first generator phase G1, and the second circuit unit U2 is connected to a second generator phase G2, and the third circuit unit U1 is connected to a third generator phase G3. In this way, the current amplitudes in each of the three generator phases G1 to G3 can be ascertained and monitored.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A monitoring device comprising:
a first line section with a first connection point and a second connection point spaced apart from the first connection point in a direction of the line;
a control unit;
a first current sensing unit comprising:
a first current source connectable to the first connection point via a first connecting line and connectable to the second connection point via a second connecting line, the first current source being configured to output a first current;
a first switch having a control input, the first switch being inserted into the second connecting line and being configured to connect or disconnect the first current source to the second connection point; and
a first differential amplifier having a first input, a second input, and an output, the first input being connectable to the first connection point via a third connecting line, the second input being connectable to the second connection point by a fourth connecting line;
wherein the control unit is inserted between the output of the first differential amplifier and the control input of the first switch,
wherein an actual current is passed through the first line section,
wherein, in a first state, the first switch is closed and the first current is impressed on the first line section in addition to the first actual current, and a first voltage, determined by the amplitude of the actual current and the amplitude of the first current, is present between the first input and the second input of the first differential amplifier,
wherein, in a second state, the first switch is open and a second voltage, determined exclusively by the actual current, is present between the first input and the second input of the first differential amplifier,
wherein the control unit is configured to ascertain the amplitude of the actual current from the first voltage of the first state and the second voltage of the second state, and
wherein the first switch is either in the first state or in the second state.

2. The monitoring device according to claim 1, wherein the first current is a direct current or an alternating current.

3. The monitoring device according to claim 1, wherein the first current source has a control input connectable to the control unit.

4. The monitoring device according to claim 1, wherein the first current sensing unit includes an ADC (analog to digital converter), and wherein the ADC is connectable between the output of the first differential amplifier and the control unit.

5. The monitoring device according to claim 1, wherein the first current source is connectable to the first line section via a first bridge switch, a second bridge switch, a third bridge switch, and a fourth bridge switch in the form of an H-bridge circuit.

6. The monitoring device according to claim 1, wherein the first differential amplifier is connectable to the first line section via an H-bridge circuit.

7. The monitoring device according to claim 4, wherein a first circuit arrangement includes a first differential amplifier and a first analog-to-digital converter connected to the first line section via an H-bridge circuit.

8. The monitoring device according to claim 1, further comprising a second line section having a second current sensing unit and a second differential amplifier, wherein a second current is provided to the second line section.

9. The monitoring device according to claim 8, wherein the second line section is directly adjacent to the first line section.

10. The monitoring device according to claim 8, wherein the control unit has a third differential amplifier, wherein a first input of the third differential amplifier is connectable to the output of the first differential amplifier and a second input of the third differential amplifier is connectable to the output of the second differential amplifier, and wherein a first differential amplifier, a second differential amplifier, and a third differential amplifier form a multi-stage amplifier unit.

11. The monitoring device according to claim 8, wherein the first current and the second current are essentially opposite and equal in amplitude.

12. A monitoring device comprising:
a first line section with a first connection point and a second connection point spaced apart from the first connection point in a direction of the line;
a control unit;
a first current sensing unit comprising:
a first current source connectable to the first connection point via a first connecting line and connectable to the second connection point via a second connecting line, the first current source being configured to output a first current;
a first switch having a control input, the first switch being inserted into the second connecting line and being configured to connect or disconnect the first current source to the second connection point; and a first differential amplifier having a first input, a second input, and an output, the first input being connectable to the first connection point via a third connecting line, the second input being connectable to the second connection point by a fourth connecting line;

wherein the control unit is inserted between the output of the first differential amplifier and the control input of the first switch, wherein an actual current is passed through the first line section, wherein, in a first state, the first switch is closed and the first current is impressed on the first line section in addition to the first actual current, and a first voltage, determined by the amplitude of the actual current and the amplitude of the first current, is present between the first input and the second input of the first differential amplifier, wherein, in a second state, the first switch is open and a second voltage, determined exclusively by the actual current, is present between the first input and the second input of the first differential amplifier, wherein the control unit is configured to ascertain the amplitude of the actual current from the first voltage and the second voltage, and wherein the control unit is configured to ascertain the amplitude of the actual current via a value of the voltage in the first state and via a value of the voltage in the second state and via the amplitude of the first current.

13. The monitoring device according to claim 1, wherein the control unit is configured to ascertain the amplitude of the actual current without calculation or knowledge of the resistance of the first line section.

14. A method for monitoring a first line section using a monitoring device, the method comprising:

providing the first line section with a first connection point and a second connection point spaced apart from the first connection point in a direction of the line;

providing a control unit; and providing a first current sensing unit, the first current sensing unit comprising:

a first current source connectable via a first connecting line to the first connection point and connectable via a second connecting line to the second connection point, the first current source being configured to output a first current; a first switch having a control input, the first switch being configured to be inserted into the first connecting line and being configured to connect or disconnect the first current source to the first connection point; a first differential amplifier with a first input, a second input, and an output, the first input being connectable to the first connection point via a third connecting line and the second input being connectable to the second connection point by a fourth connecting line;

inserting the control unit between an output of a first differential amplifier and a control input of the first switch;

passing an actual current through the first line section;

closing, in a first state, the first switch such that the first current is impressed on the first line section in addition to the actual current and a first voltage determined by the amplitude of the actual current and the amplitude of the first current is present between the first input and the second input of the first differential amplifier;

opening, in a second state, the first switch such that a second voltage determined exclusively by the first actual current is present between the first input and the second input of the first differential amplifier; and ascertaining, via the control unit, an amplitude of the first actual current from the first voltage in the first state and the second voltage in the second state, wherein the first switch is either in the first state or in the second state.

15. The method according to claim 14, wherein an alternating current is fed into the first line section via the control unit, and wherein the amplitude of the actual current is ascertained via a lock-in principle.

16. A method for monitoring a first line section using a monitoring device, the method comprising:

providing the first line section with a first connection point and a second connection point spaced apart from the first connection point in a direction of the line;

providing a control unit; and providing a first current sensing unit, the first current sensing unit comprising:

a first current source connectable via a first connecting line to the first connection point and connectable via a second connecting line to the second connection point, the first current source being configured to output a first current; a first switch having a control input, the first switch being configured to be inserted into the first connecting line and being configured to connect or disconnect the first current source to the first connection point; a first differential amplifier with a first input, a second input, and an output, the first input being connectable to the first connection point via a third connecting line and the second input being connectable to the second connection point by a fourth connecting line;

inserting the control unit between an output of a first differential amplifier and a control input of the first switch;

passing an actual current through the first line section;

closing, in a first state, the first switch such that the first current is impressed on the first line section in addition to the actual current and a first voltage determined by the amplitude of the actual current and the amplitude of the first current is present between the first input and the second input of the first differential amplifier;

opening, in a second state, the first switch such that a second voltage determined exclusively by the first actual current is present between the first input and the second input of the first differential amplifier; and ascertaining, via the control unit, an amplitude of the first actual current from the first voltage and the second voltage, wherein the amplitude of the actual current is ascertained by the control unit via a value of the voltage in the first state and via a value of the voltage in the second state and the amplitude of the first current.

17. The monitoring device according to claim 1, wherein the monitoring device is configured to monitoring phase currents of a generator or an electric motor.

18. The monitoring device according to claim 1, wherein the monitoring device is configured to ascertain a state of charge of a battery or for monitoring a current amplitude in a positive branch between the battery and a load, or for monitoring the magnitude of the current in a positive branch between the battery within the on-board power network of an automobile and a load.

19. The monitoring device according to claim 1, wherein the monitoring device is configured to monitor a current in ground leads in a motor vehicle.

20. The monitoring device according to claim 1, wherein the monitoring device is configured for calibration of current amplitudes in the first line section, and wherein a variation of the current amplitudes in the line first section spans at least a factor of ten.

21. A monitoring device comprising:
a first line section with a first connection point and a second connection point spaced apart from the first connection point in a direction of the line;
a second line section with a third connection point spaced apart from the second connection part in the direction of the line, the second line section being connected to the first line section at the second connection point;
a control unit;
a first current sensing unit comprising:
a first current source connectable to the first connection point via a first connecting line and connectable to the second connection point via a second connecting line, the first current source being configured to output a first current;
a first switch having a control input, the first switch being inserted into the second connecting line and being configured to connect or disconnect the first current source to the second connection point; and
a first differential amplifier having a first input, a second input, and an output, the first input being receiving a signal based on a voltage difference between the first connection point and the second connection point , the second input receiving a signal based on a voltage difference between the second connection point and the third connection point;
wherein the control unit is inserted between the output of the first differential amplifier and the control input of the first switch,
wherein an actual current is passed through the first line section,
wherein, in a first state, the first switch is closed and the first current is impressed on the first line section in addition to the first actual current and a first voltage determined by the amplitude of the actual current and the amplitude of the first current is present between the first input and second input of the first differential amplifier,
wherein, in a second state, the first switch is open and a second voltage determined exclusively by the actual current is present between the first input and second input of the first differential amplifier, and
wherein the control unit is configured to ascertain the amplitude of the actual current from the first and second voltage.

22. A method for monitoring a first line section using a monitoring device, the method comprising:
providing the first line section with a first connection point and a second connection point spaced apart from the first connection point in a direction of the line;
providing a second line section with a third connection point spaced apart from the second connection part in the direction of the line, the second line section being connected to the first line section at the second connection point;
providing a control unit; and
providing a first current sensing unit, the first current sensing unit comprising: a first current source connectable via a first connecting line to the first connection point and connectable via a second connecting line to the second connection point, the first current source being configured to output a first current; a first switch having a control input, the first switch being configured to be inserted into the first connecting line and being configured to connect or disconnect the first current source to the first connection point; a first differential amplifier with a first input, a second input, and an output, the first input being receiving a signal based on a voltage difference between the first connection point and the second connection point and the second input being receiving a signal based on a voltage difference between the second connection point and the third connection point;
inserting the control unit between the output of the first differential amplifier and the control input of the first switch;
passing an actual current through the first line section;
closing, in a first state, the first switch such that the first current is impressed on the first line section in addition to the actual current and a first voltage determined by the amplitude of the actual current and the amplitude of the first current is present between the first input and second input of the first differential amplifier;
opening, in a second state, the first switch such that a second voltage determined exclusively by the first actual current is present between the first input and second input of the first differential amplifier; and
ascertaining an amplitude of the first actual current from the first and second voltage via the control unit.

* * * * *